United States Patent
Weberg et al.

(10) Patent No.: US 9,843,334 B2
(45) Date of Patent: Dec. 12, 2017

(54) FREQUENCY SYNTHESIZER

(71) Applicant: Nordic Semiconductor ASA, Trondheim (NO)

(72) Inventors: Stein Erik Weberg, Trondheim (NO); Ola Bruset, Trondheim (NO)

(73) Assignee: Nordic Semiconductor ASA, Trondheim (NO)

(*) Notice: Subject to any disclaimer, the term of this patent is extended or adjusted under 35 U.S.C. 154(b) by 0 days.

(21) Appl. No.: 15/125,038

(22) PCT Filed: Mar. 5, 2015

(86) PCT No.: PCT/GB2015/050632
§ 371 (c)(1),
(2) Date: Sep. 9, 2016

(87) PCT Pub. No.: WO2015/136242
PCT Pub. Date: Sep. 17, 2015

(65) Prior Publication Data
US 2017/0026050 A1    Jan. 26, 2017

(30) Foreign Application Priority Data

Mar. 12, 2014   (GB) .................................. 1404346.7

(51) Int. Cl.
*H03L 7/193* (2006.01)
*H03L 7/081* (2006.01)
(Continued)

(52) U.S. Cl.
CPC ........... *H03L 7/193* (2013.01); *H03K 3/0372* (2013.01); *H03L 7/081* (2013.01); *H03L 7/1974* (2013.01); *H03L 7/1976* (2013.01); *H04L 7/0331* (2013.01)

(58) Field of Classification Search
CPC ....... H03L 7/193; H03L 7/081; H03L 7/1974; H03L 7/1976; H03L 7/0331; H03K 3/0372
(Continued)

(56) References Cited

U.S. PATENT DOCUMENTS 6,671,341 B1 * 12/2003 Kinget ...................... H03L 7/00
375/373
7,298,218 B2 * 11/2007 Ghazali ................... H03L 7/081
327/156
(Continued)

FOREIGN PATENT DOCUMENTS

JP      2001 177404 A      6/2001

OTHER PUBLICATIONS

Bilhan et al., Spur-Free Fractional-N PLL Utilizing Precision Frequency and Phase Selection, *2006 IEEE/Dallas/CAS Workshop on Design, Applications, and Software*, Oct. 2006, 4 pages.
(Continued)

*Primary Examiner* — Brandon S Cole
(74) *Attorney, Agent, or Firm* — Klarquist Sparkman, LLP

(57) ABSTRACT

A phase locked loop frequency synthesizer is arranged to provide a target frequency output signal for a radio transmitter or receiver. The synthesizer comprises: a voltage controlled oscillator (2) operating at a first frequency; a first, fixed frequency divider to provide a second frequency, a pre-scaler to provide a variable frequency division of said second frequency to produce a third frequency, said pre-scaler comprising: a second frequency divider (14) connected to said first output (12) and providing a second output at a second frequency; and a phase detector (4) controlling said voltage controlled oscillator (2) on the basis of a comparison between a reference signal and a signal depen-
(Continued)

dent on said third frequency; wherein the synthesizer is configured so that said first output (10, 12) provides said target frequency output signal.

9 Claims, 4 Drawing Sheets

(51) Int. Cl.
*H03L 7/00* (2006.01)
*H03L 7/197* (2006.01)
*H03K 3/037* (2006.01)
*H04L 7/033* (2006.01)

(58) Field of Classification Search
USPC .............. 327/2–12, 105–123, 141, 144–163; 331/1 A, 15–17; 375/373–376
See application file for complete search history.

(56) References Cited

U.S. PATENT DOCUMENTS

| | | | | |
|---|---|---|---|---|
| 8,024,598 | B2* | 9/2011 | Kim | H03L 7/0996 375/130 |
| 2003/0068003 | A1* | 4/2003 | Casagrande | H03K 23/667 377/47 |
| 2005/0088210 | A1* | 4/2005 | Chen | H03K 23/68 327/115 |
| 2005/0236264 | A1* | 10/2005 | Asada | H01H 13/48 200/406 |
| 2005/0280473 | A1* | 12/2005 | Puma | H03C 3/0925 331/16 |
| 2006/0056561 | A1* | 3/2006 | Zhang | H03L 7/087 375/376 |
| 2006/0133559 | A1* | 6/2006 | Glass | H03L 7/0891 375/376 |
| 2007/0041486 | A1* | 2/2007 | Shin | H03L 7/081 375/376 |
| 2008/0164917 | A1* | 7/2008 | Floyd | H03L 7/1974 327/117 |
| 2009/0243680 | A1* | 10/2009 | Yamaguchi | H03K 5/135 327/161 |
| 2009/0296878 | A1 | 12/2009 | Tsai | |
| 2010/0164562 | A1* | 7/2010 | Tseng | G06F 1/08 327/118 |
| 2012/0242384 | A1* | 9/2012 | Kato | H03L 7/097 327/157 |
| 2013/0214827 | A1* | 8/2013 | Fong | H03L 7/00 327/141 |
| 2014/0184281 | A1* | 7/2014 | Danny | H03L 7/081 327/115 |
| 2015/0188552 | A1* | 7/2015 | Kim | H03L 7/093 327/157 |

OTHER PUBLICATIONS

Craninckx et al., "A 1.75-GHz/3-V dual-modulus divide-by-128/129 prescaler in 0.7-/spl mu/m CMOS," *IEEE Journal of Solid-State Circuits*, vol. 31, No. 7, Jul. 1996, pp. 890-897.

International Search Report and Written Opinion from the International Searching Authority for PCT/GB2015/050632, dated May 22, 2015, 9 pages.

Search Report under Section 17(5) from the Great Britain Intellectual Property Office for GB1404346.7, dated Aug. 29, 2014, 4 pages.

* cited by examiner

FREQUENCY SYNTHESIZER

CROSS REFERENCE TO RELATED APPLICATIONS

This is the U.S. National Stage of International Application No. PCT/GB2015/050632, filed Mar. 5, 2015, which was published in English under PCT Article 21(2), which in turn claims the benefit of Great Britain Application No. 1404346.7, filed Mar. 12, 2014. The Great Britain application is incorporated by reference herein in its entirety.

This invention relates to a phase locked loop (PLL) frequency synthesizer for use in a tuned radio transmitter or receiver.

PLL frequency synthesizers are used in tuned radio transmitters and receivers as the first local oscillator (LO) to generate the radio frequency (RF) signal of the required frequency from a reference crystal oscillator, for example generating a signal in the 2.4 GHz band from a 32 MHz crystal. In order to tune to specific frequencies within a given band it is necessary to be able to alter the PLL frequency to such specific frequencies. This is achieved by using a counter acting as a frequency divider to reduce the frequency of the voltage controlled oscillator (VCO) before it is fed to the phase detector.

There are two main classes of PLL. The first is known as an 'integer N' PLL in which the frequency divider operates on a fixed count N to give a frequency which is an integer multiple of the reference crystal frequency. In the above example this would only allow a channel spacing of 32 MHz which is not compatible with the requirement for 1 MHz channel spacing used in Bluetooth™ and other short range radio data communication protocols. The alternative—using a lower reference frequency, say 1 MHz—is not desirable since, for stability reasons, this would limit the maximum bandwidth of the phase-locked loop to somewhere around $\frac{1}{20}$th to $\frac{1}{10}$th of the reference frequency and this in turn increases average power consumption in the application due to long start-up time. The reason for this bandwidth limitation is the sampling action of the phase detector: phase is only known to the phase detector at discrete points in time: when there is actually an edge in the clock signal. Therefore, on average, the phase information is delayed by half a clock cycle before it generates a correction pulse at the phase detector and this is equivalent of having a phase which is linear with frequency. When the loop bandwidth is increased beyond $\frac{1}{20}$th to $\frac{1}{10}$th of the sampling clock frequency, the feedback delay will start to affect the overall phase margin of the loop.

In order to achieve smaller channel spacings it is therefore desirable to use the second class of PLLs: 'fractional N' PLLs. In such arrangements the counter does not have a fixed count but switches the count between cycles—to give, averaged over time, the required frequency signal. In the simplest case the counts used may be selected from two adjacent numbers but in most practical systems more than two different numbers are used.

Such an arrangement can deliver the desired function but the Applicant believes that in some circumstances further improvement to such an arrangement is possible.

When viewed from a first aspect the present invention provides a phase locked loop frequency synthesizer arranged to provide a target frequency output signal for a radio transmitter or receiver, the synthesizer comprising:
  a voltage controlled oscillator operating at a first frequency;
  a first, fixed frequency divider arranged to provide a first output at a second frequency, wherein said second frequency is a fixed fraction of said first frequency;
  a pre-scaler arranged to provide a variable frequency division of said second frequency to produce a third frequency, said pre-scaler comprising:
    a second frequency divider connected to said first output and providing a second output at a second frequency; and
    a phase selector arrangement arranged selectively to alter a phase of said second output in order to alter said second frequency.
  a frequency controller controlling said pre-scaler and thereby controlling said third frequency; and
  a phase detector controlling said voltage controlled oscillator on the basis of a comparison between a reference signal and a signal dependent on said third frequency;
wherein the synthesizer is configured so that said first output provides said target frequency output signal.

Thus it will be seen that in accordance with the invention the VCO operates at a multiple of the target output frequency and the output is only taken after a corresponding divider. In a preferred set of embodiments the fixed fraction is half—i.e. the VCO operates at twice the target frequency. An advantage of this arrangement is that the quantisation noise associated with the frequency controller is reduced (e.g. halved) as a result of the output frequency being reduced (e.g. halved) before the adjustable pre-scaler is applied because the pre-scaler output can produce phases in discrete steps equal to the period of the VCO. Quantisation noise is not only a problem at high frequencies but also has an impact at lower frequencies since the noise tends to be 'folded' into the lower frequencies at the phase detector from where it cannot be removed by the low pass filter typically provided between the phase detector and the VCO. In accordance with embodiments of the invention therefore this issue may be improved.

The recited pre-scaler comprising a phase selector arrangement has been found to enable the second frequency to be altered temporarily without needing a further frequency divider running at twice (or whatever multiple is chosen) the target output frequency. For example in a particular embodiment a counter used as a divide-by-eight frequency divider in conjunction with a positive edge phase detector can be made to divide by nine for one cycle by bringing its phase forward by ninety degrees. Of course other combinations of phase shift and divisions are possible.

In a set of embodiments the first frequency divider comprises a master-slave flip flop arrangement. Whilst this is known per se as a common way to provide a frequency divider which divides the incoming frequency by two, the Applicant has appreciated that there is a significant benefit in employing it in the context described herein since advantage can be taken of the feature that it automatically makes available output signals at a ninety degree phase spacing (by taking the outputs of the master and slave flip-flops respectively). These may be used directly as the in-phase (I) and quadrature (Q) signals used in may digital radio systems. Preferably the first frequency divider is arranged to divide the incoming frequency by two.

The third frequency may be fed directly to the phase detector or a further frequency divider may be employed (alternatively this could be seen as forming part of the overall pre-scaler).

In a set of embodiments the frequency controller comprises a sigma-delta modulator. This provides a signal indicative of when a temporary frequency alteration should be effected.

The invention extends to a radio transmitter comprising a frequency synthesizer as described above and to a radio receiver as described above. Such a transmitter and receiver may be integrated with one another. The transmitter and/or receiver may be provided on a semiconductor integrated circuit.

An embodiment of the invention will now be described, by way of example only, with reference to the accompanying drawings in which.

Figure 1:
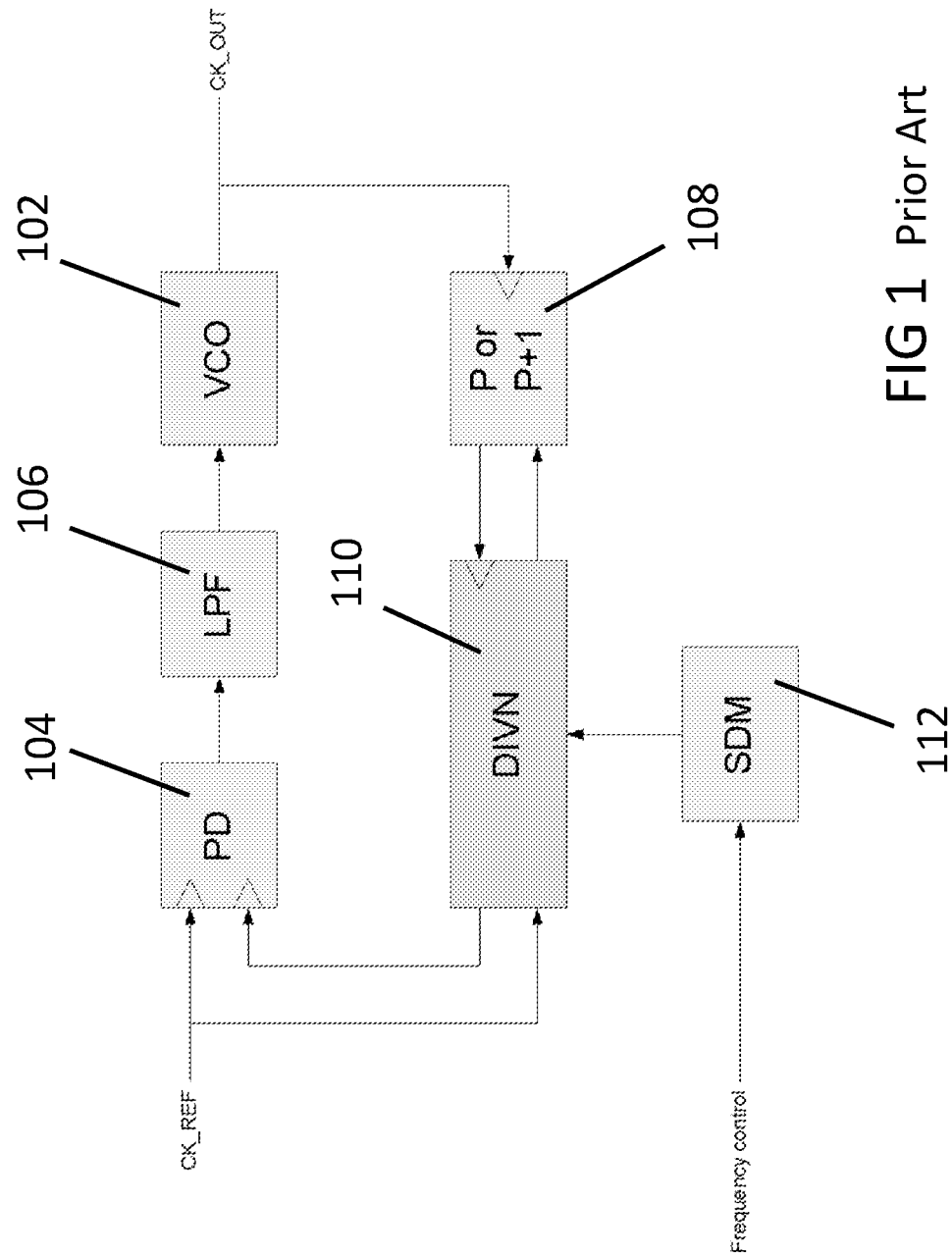
FIG. 1 is schematic diagram of a known PLL frequency synthesizer shown for reference purposes only.

A conventional fractional N PLL is shown in FIG. 1. As with any PLL this is based on a VCO 102 which is controlled by a phase detector 104 via a low-pass filter 106. The phase detector 104 causes small adjustments to the frequency of the VCO 102 in order to bring the phase (and therefore frequency) of the fed-back signal into alignment with the reference clock CK_REF. It will be noted that the VCO 102 is running at the output frequency CK_OUT.

A pre-scaler circuit 108 is used to divide the frequency by P or P+1 depending upon the control signal it receives from a further divider module 110, which divides the frequency by a further integer N before feeding the phase detector 104. The frequency of the VCO 102 is therefore controlled to be $F_{ref}*N*(nP+m(P+1))$ where $F_{ref}$ is the reference crystal frequency and n and m are the relative proportions of the occurrences of the respective counts P and P+1 over a given time period.

The divider module 110 is controlled by a sigma-delta modulator (SDM) 112 to determine the above-mentioned relative proportions of P and P+1 counts, so determining the precise frequency. In this circuit there is inevitably quantisation noise coming from the SDM 112 corresponding to steps of 32 MHz (the reference frequency, $F_{ref}$).

The precisely divided average frequency signal is fed to the phase detector 104 which generates an output signal to control the VCO 102 in accordance with any mismatch between the signal from the divider 110 and the reference clock input signal CK_REF.

Figure 2:
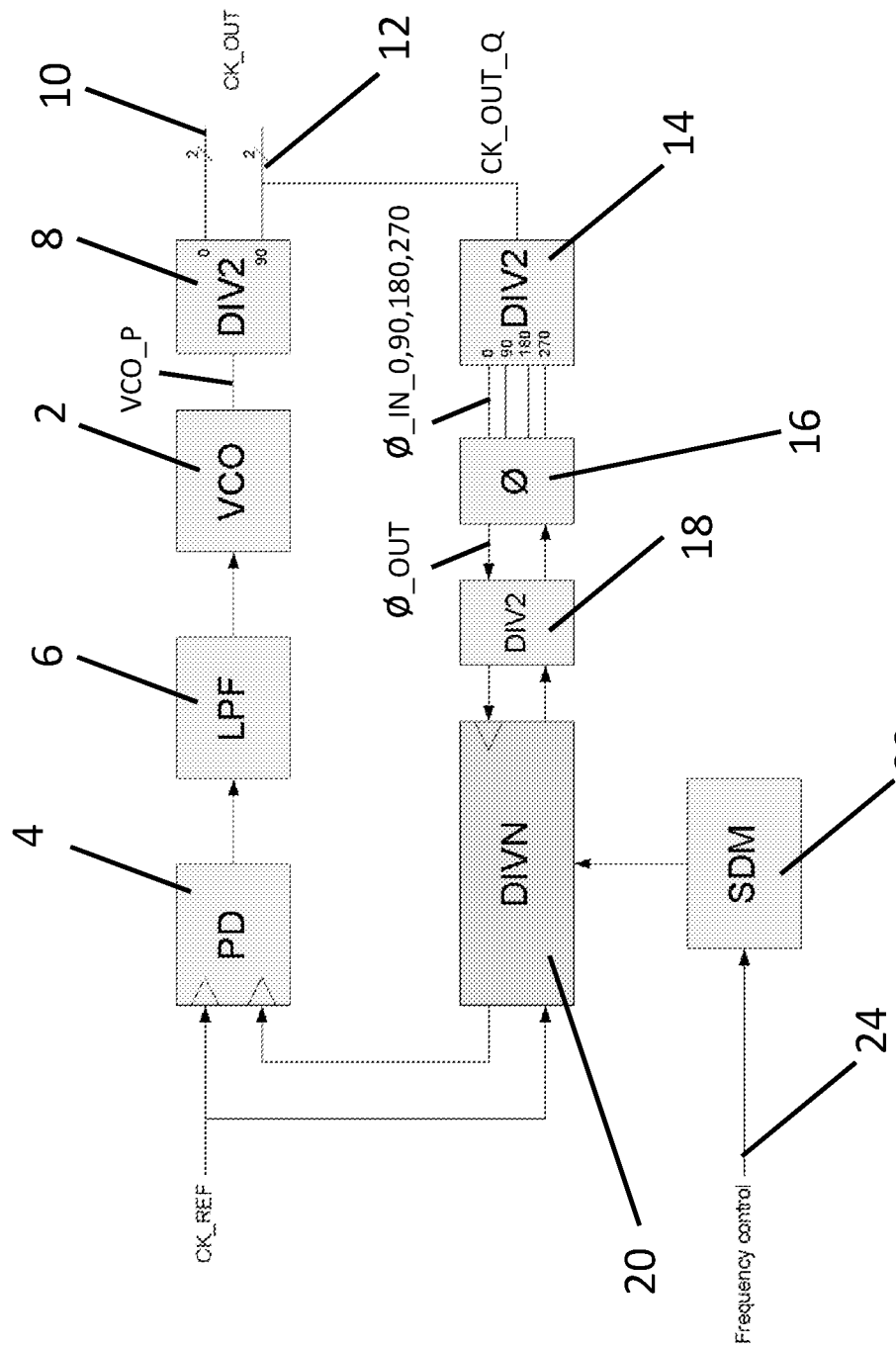
FIG. 2 is a schematic diagram of a PLL frequency synthesizer in accordance with an embodiment of the invention.

An embodiment of the present invention is shown in FIG. 2. In this embodiment there is also provided a phase-locked loop based on a voltage-controlled oscillator 2 which is controlled by a phase detector 4, via a low-pass filter 6. In this arrangement however rather than the VCO 2 providing the CK_OUT signal directly, the output of the VCO 2 is instead fed to a divide-by-two module 8. This means that the VCO 2 runs at twice the desired output frequency.

Figure 3:
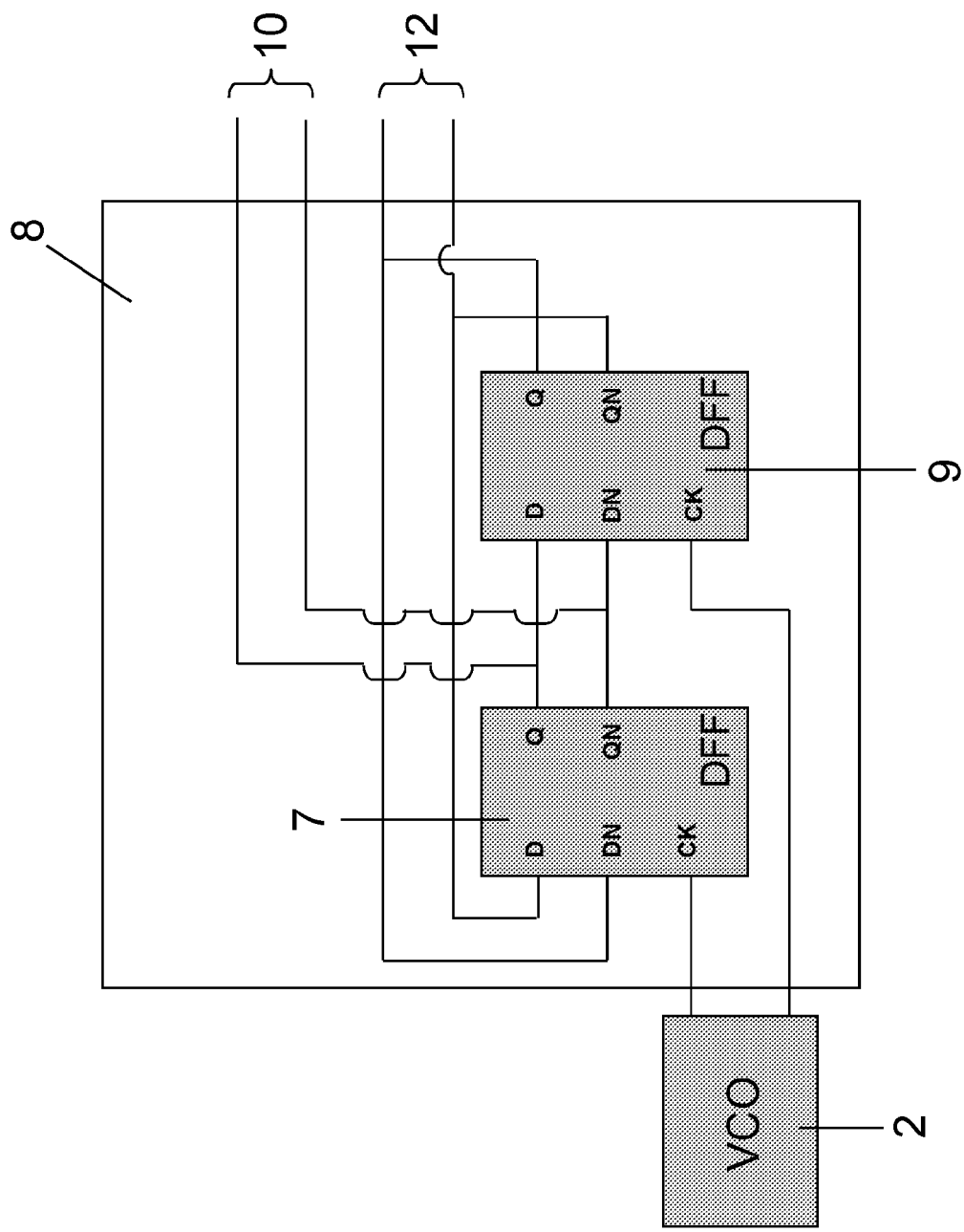
FIG. 3 is a schematic diagram of a divide-by-two frequency divider using master/slave flip-flops.

As is shown in FIG. 3 the divider is based on a master/slave flip-flop arrangement comprising a pair of D-type flip-flops 7, 9. Such an arrangement can be used as the divider 8 is a fixed divide-by-two module and is not required to alter its output. One advantage of this arrangement is that it provides two outputs: the first output 10 provided by the Q and QN outputs of the first flip-flop 7 being in phase with the input and the second output 12 provided by the Q and QN outputs of the second flip-flop 9 being 90° out of phase with the input. As will be apparent to those skilled in the art this provides the in-phase (I) and quadrature (Q) signals required in conventional digital radio architectures. Such an arrangement is known per se in the art but has been recognised as being particularly advantageous in the present context.

The second, 90° shifted output 12 is fed to a further divide-by-two module 14. This has the feature that the phase of its output can be brought forward by 90°, 180° or 270° depending on the signal it receives from a phase selector 16. As will be explained further below, this effectively allows an additional count in a given cycle thus allowing fine-tuning of the average frequency of its output signal in a manner analogous to the variable divider 108 described above with reference to FIG. 1. An example of a suitable circuit arrangement giving this feature is shown in "A 1.75-GHz/3-V dual-modulus divide-by-128/129 prescaler in 0.7-µm CMOS. Craninckx, J.; Steyaert, M. S. J. Solid-State Circuits, IEEE Journal of. Volume: 31 Issue: 7, Page(s): 890-897.

The output ø_OUT of the divider and phase selector arrangement 14, 16 is fed to a further fixed divider 18 which divides the frequency by two before interfacing with a frequency controller module 20 which carries out further division of the output from the preceding divider 18 down to the reference frequency CK_REF and controls the phase selection in the module 16. The module 20 is controlled by a sigma-delta modulator 22 to effect frequency control from the frequency control input 24 in a similar manner to the arrangement described above with reference to FIG. 1.

Although the arrangement shown in FIG. 2 requires a divider module 8 operating at twice the output frequency, as mentioned above one of the advantages of the overall circuit arrangement is that because a fixed ratio divider module 8 is used, this can be implemented using a master/slave flip-flop arrangement which provides direct I and Q signals and so obviates the need for a second divider running at twice the output frequency or even another PLL. The other dividers 14, 18, 20 are clocked by the preceding one or by the reference clock CK_REF and so operate at lower frequencies.

Another advantage achieved by the embodiment described above is that because the frequency is halved before it is output, the step size is reduced to 16 MHz instead of 32 MHz which corresponds to up to a 6 dB reduction in SDM phase noise on the outputs 10, 12.

In operation the circuit shown in FIG. 2 can either divide the frequency of the VCO 2 by eight—arising from division by two at each of the dividers 8, 14 and 18—or it can divide the frequency by nine. This is achieved by bringing forward the phase of the intermediate divider 14 by 90°. This means that the next positive edge of the signal seen by module 20 is after nine cycles of the VCO 2 as may be seen more clearly from the timing diagram in FIG. 4.

Figure 4:
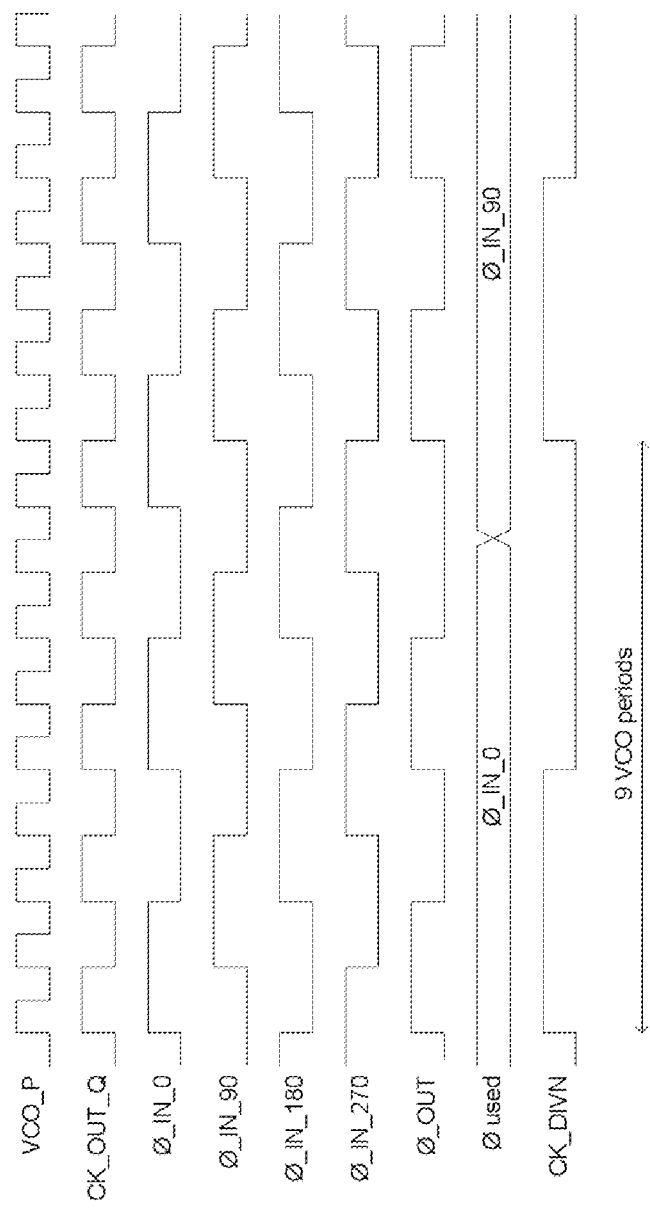
FIG. 4 is a timing diagram illustrating how frequency variation is achieved.

FIG. 4 is s timing diagram for various parts of the circuit shown in FIG. 2. The top plot VCO_P is one of two outputs from the VCO 2. The next plot CK_OUT_Q is the output 12 from the divider 8 which is used to clock the divide-by-two module 14. The next four plots ø_IN_0, ø_IN_90, ø_IN_180 and ø_IN_270 are the four possible outputs ø_OUT of the divide-by-two module 14. The plot below these four is the actual output, ø_OUT. Below this is ø used, indicates which of the four possible outputs is selected at a given time and the actual output As may be seen the selected one of the ø_IN signals is passed through the phase selector module 16 to the further divide-by-two module 18. The output of this module 18 provides the clock input CK_DIVN to the DIVN module 20, which is therefore at half the frequency of ø_OUT.

In use in the example shown in FIG. 4 ø_IN_0 is used for the first three clock cycles of CK_OUT_Q and then during the fourth clock cycle the phase selector 16 receives a signal from the dividers 20 and 18 to start using the ø_IN_90 input instead of the ø_IN_0 input. The effect of this is that the ø_IN_90 is used as the output ø_OUT which therefore prolongs the low part of the signal seen at ø_OUT. As indicated at the bottom of FIG. 4 the resultant impact is that a full cycle of the CK_DIVN signal is nine cycle periods of the VCO 2 rather than eight which it would have been had the ø_IN_90 signal not been used. The use of this signal therefore allows the overall divider arrangement 14, 16, 18 to divide by eight or nine depending upon the control inputs applied to the phase selector 16.

It follows from this that by choice of the relative proportions of the divide by eight and divide by nine counts, the average frequency of the outputs 10,12 can be changed from eight times the reference frequency $F_{ref}$ to nine times the reference frequency $F_{ref}$ in small steps—e.g. of 1 MHz.

The invention claimed is:

1. A phase locked loop frequency synthesizer arranged to provide a target frequency output signal for a radio transmitter or receiver, the synthesizer comprising:
    a voltage controlled oscillator operating at a first frequency;
    a first, fixed frequency divider arranged to provide a first output at a second frequency, wherein said second frequency is a fixed fraction of said first frequency;
    a pre-scaler arranged to provide a variable frequency division of said second frequency to produce a third frequency, said pre-scaler comprising:
        a second frequency divider connected to said first output and providing a second output at the third frequency; and
        a phase selector arrangement arranged selectively to alter a phase of said second output in order to alter said third frequency;
    a frequency controller controlling said pre-scaler and thereby controlling said third frequency; and
    a phase detector controlling said voltage controlled oscillator on the basis of a comparison between a reference signal and a signal dependent on said third frequency;
    wherein the synthesizer is configured so that said first output provides said target frequency output signal;
    wherein the first frequency divider is arranged to provide the first output and a further output, the further output being at the second frequency and 90 degrees out of phase with the first output, and wherein the synthesizer is configured to provide said first output and said further output as target frequency output signals.

2. A synthesizer as claimed in claim 1 wherein the fixed fraction is half.

3. A synthesizer as claimed in claim 1 wherein the first frequency divider comprises a master-slave flip flop arrangement.

4. A synthesizer as claimed in claim 1 wherein the frequency controller comprises a sigma-delta modulator.

5. A radio transmitter comprising a frequency synthesizer as claimed in claim 1.

6. A radio transmitter as claimed in claim 5 provided on a semiconductor integrated circuit.

7. A radio receiver comprising a frequency synthesizer as claimed in claim 1.

8. A radio receiver as claimed in claim 7 provided on a semiconductor integrated circuit.

9. A synthesizer as claimed in claim 1 wherein the pre-scaler is arranged to provide a variable frequency division of said first output only to produce the third frequency.

* * * * *